(12) United States Patent
Wu et al.

(10) Patent No.: US 11,817,380 B2
(45) Date of Patent: Nov. 14, 2023

(54) SEMICONDUCTOR PACKAGE AND METHOD OF FORMING SAME

(71) Applicant: Taiwan Semiconductor Manufacturing Co., Ltd., Hsinchu (TW)

(72) Inventors: Jiun Yi Wu, Zhongli (TW); Chen-Hua Yu, Hsinchu (TW); Chung-Shi Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 22 days.

(21) Appl. No.: 17/187,138

(22) Filed: Feb. 26, 2021

(65) Prior Publication Data
US 2022/0278036 A1    Sep. 1, 2022

(51) Int. Cl.
*H01L 23/498* (2006.01)
*H01L 23/31* (2006.01)
*H01L 23/00* (2006.01)
*H01L 21/48* (2006.01)

(52) U.S. Cl.
CPC .... *H01L 23/49833* (2013.01); *H01L 21/4853* (2013.01); *H01L 21/4857* (2013.01); *H01L 23/31* (2013.01); *H01L 23/49811* (2013.01); *H01L 23/49822* (2013.01); *H01L 23/562* (2013.01); *H01L 24/16* (2013.01); *H01L 2224/16227* (2013.01)

(58) Field of Classification Search
CPC .................................................. H01L 23/49833
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |

(Continued)

*Primary Examiner* — Selim U Ahmed
*Assistant Examiner* — Evan G Clinton
(74) *Attorney, Agent, or Firm* — Slater Matsil, LLP

(57) ABSTRACT

In an embodiment, a method for manufacturing a semiconductor device includes forming a redistribution structure on a carrier substrate, connecting a plurality of core substrates physically and electrically to the redistribution structure with a first anisotropic conductive film, the first anisotropic conductive film including a dielectric material and conductive particles, and pressing the plurality of core substrates and the redistribution structure together to form conductive paths between the plurality of core substrates and the redistribution structure with the conductive particles in the first anisotropic conductive film. The method also includes encapsulating the plurality of core substrates with an encapsulant. The method also includes and attaching an integrated circuit package to the redistribution structure, the redistribution structure being between the integrated circuit package and the plurality of core substrates, the integrated circuit package laterally overlapping a first core substrate and a second core substrate of the plurality of core substrates.

20 Claims, 21 Drawing Sheets

(56) References Cited

U.S. PATENT DOCUMENTS

| | | | |
|---|---|---|---|
| 9,496,189 B2 | 11/2016 | Yu et al. | |
| 9,666,502 B2 | 5/2017 | Chen et al. | |
| 9,735,131 B2 | 8/2017 | Su et al. | |
| 2006/0043583 A1* | 3/2006 | Tamagawa | H01L 25/0657 |
| | | | 257/E23.101 |
| 2009/0020865 A1* | 1/2009 | Su | H01L 24/29 |
| | | | 257/E23.18 |
| 2010/0294547 A1* | 11/2010 | Hatanaka | H01R 12/714 |
| | | | 29/877 |
| 2014/0091827 A1* | 4/2014 | Hung | G01R 1/07378 |
| | | | 324/756.03 |
| 2017/0018468 A1* | 1/2017 | Gong | H01L 21/486 |
| 2017/0062383 A1* | 3/2017 | Yee | H01L 23/3675 |
| 2018/0204791 A1* | 7/2018 | Chen | H01L 23/49894 |
| 2019/0237430 A1* | 8/2019 | England | H01L 24/89 |
| 2020/0194402 A1* | 6/2020 | Ko | H01L 24/16 |
| 2020/0395347 A1* | 12/2020 | Yu | G02B 6/136 |
| 2021/0202332 A1* | 7/2021 | Hu | H01L 21/6835 |

\* cited by examiner

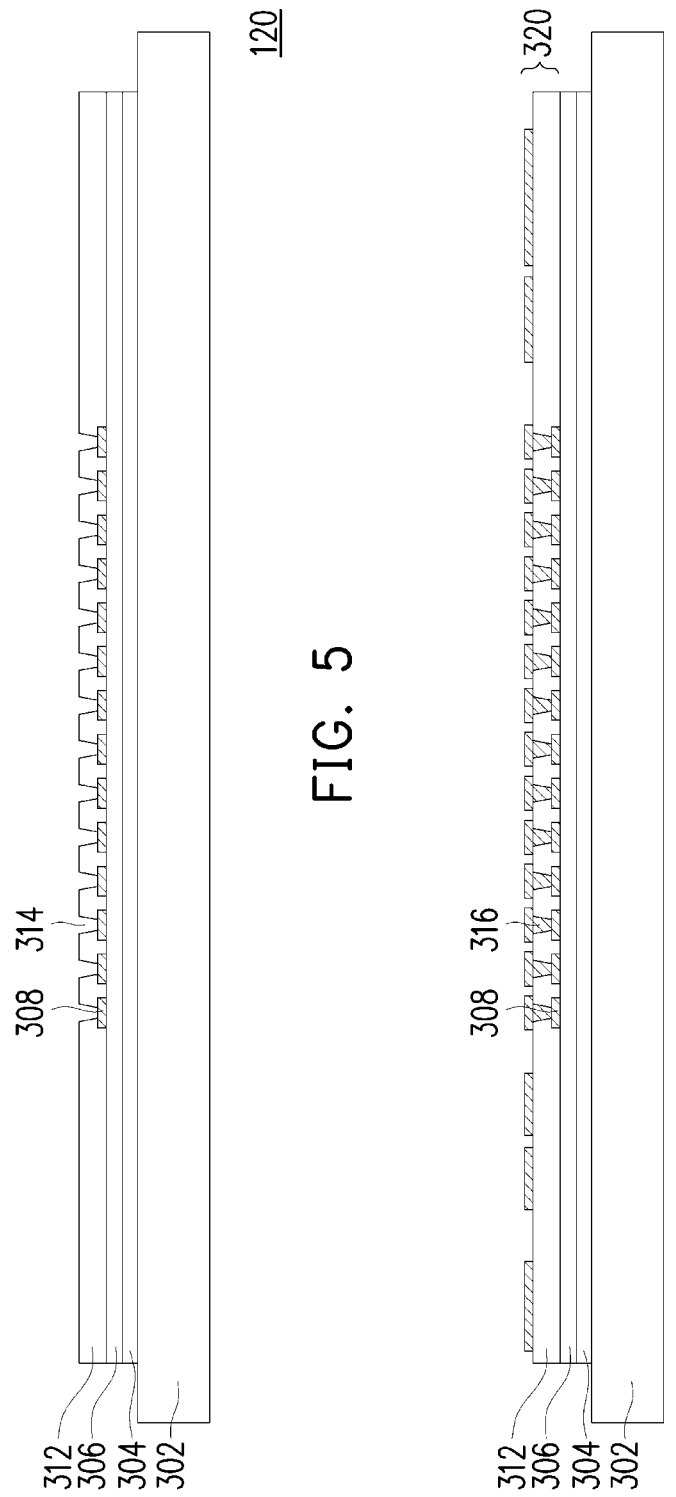

SEMICONDUCTOR PACKAGE AND METHOD OF FORMING SAME

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 15 illustrate cross-sectional views of intermediate steps during a process for forming a package component in accordance with some embodiments.

DETAILED DESCRIPTION

Figure 1:
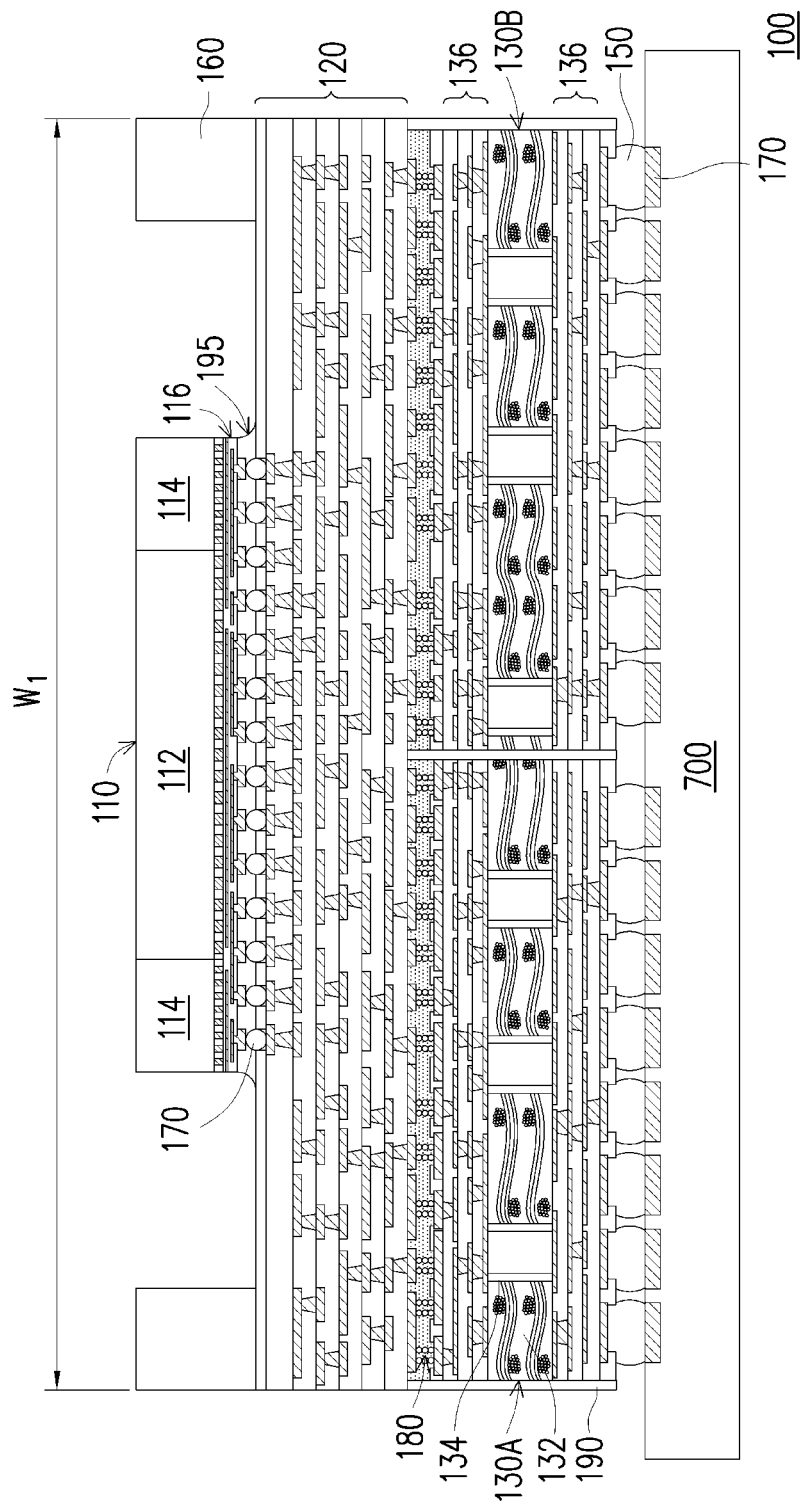
FIG. 1 illustrates a cross-sectional view of a package component in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a package component is formed having one or more integrated circuit dies. An anisotropic conductive film (sometimes referred to as an anisotropic conductive elastomer) is formed on the bottom of two or more discrete core substrates. The two or more core substrates are attached, via the anisotropic conductive film, to a redistribution structure build up. Over molding is applied to the RDL build up and two or more core substrates. The one or more integrated circuit dies are attached to the opposite side of the RDL build up as the core substrates, and BGA ball mounting may be performed on the exposed side of the core substrates.

By using processes such as those described herein, it is possible to mitigate warpage issues and improve the cost and throughput in a system on integrated substrate (SoIS) approach. Further, board level reliability can be enhanced, core substrate costs mitigated, higher yield substrates recognized due to the ability to integrate multiple smaller core substrates, and more control is provided over the warpage of the package due to the reduced coefficient of thermal expansion (CTE) mismatch provided by the anisotropic conductive film.

FIG. 1 illustrates a cross-sectional view of a singulated package component 100 in accordance with some embodiments. The singulated package component 100 includes a semiconductor device (e.g., an integrated circuit package 110) coupled to a redistribution structure 120 having one or more redistribution layers by conductive connectors 170. A protective ring 160 may be coupled to the redistribution structure and extend along a periphery of the integrated circuit package 110. In some embodiments, the protective ring 160 has a thickness in a range from 50 to 1,500 micrometers (µm). A plurality of core substrates 130 are coupled to the redistribution structure 120 on a side opposite the integrated circuit package 110 by anisotropic conductive film 180. External connectors 150 provide an electrical connection to the plurality of core substrates 130 on a side of the plurality of core substrates 130 opposite the redistribution structure 120. An encapsulant 190, such as molding film, or the like, encapsulates the plurality of core substrates 130 and the second side of the redistribution structure 120, among other elements.

The integrated circuit package 110 may include a plurality of integrated circuit dies, such as a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), an input/output (I/O) die, the like, or combinations thereof. As shown, the integrated circuit package 110 includes a logic die 112 and two I/O dies 114 for illustrative purposes. The integrated circuit dies may be formed in one or more wafers, which may include different device regions that are singulated in subsequent steps. The integrated circuit dies may be packaged with other similar or different integrated circuit dies using manufacturing techniques such as an InFO package. The integrated circuit package 110 may include a redistribution structure 116, providing electrical pathing and connection between, for example, the logic die 112 and the I/O dies 114, as well as connection from the integrated circuit package to conductive connectors 170.

Conductive connectors 170 provide the electrical connection between the redistribution structure 120 and the integrated circuit package 110. An underfill 195 may be included to securely bond the integrated circuit package 110 to the redistribution structure 120 and provide structural support and environmental protection.

As discussed in greater detail below, the redistribution structure 120 provides electrical pathing and connection between the integrated circuit package 110 and the plurality of core substrates 130 via conductive connectors 170 and the anisotropic conductive film 180. In some embodiments, the redistribution structure 120 has one or more redistribution layers comprising metallization patterns, comprising, for example, conductive lines and conductive vias, and dielectric layers separating adjacent layers of the conductive lines as discussed below, for example, in relation to FIGS. 3 through 7. The conductive lines of metallization patterns may be interconnected with an overlying or underlying conductive feature using the conductive vias.

The anisotropic conductive film 180 provides the electrical connection between the redistribution structure 120 and the core substrates 130. The anisotropic conductive film 180 may include a dielectric material and electrically conductive particles therein. The electrically conductive particles form electrical paths between the redistribution structure 120 and the core substrates 130.

The redistribution structure 120 is electrically and mechanically attached to the plurality of core substrates 130 by the anisotropic conductive film 180. Each of the plurality of core substrates 130 may include a core 132, with conductive vias 134 extending through the core 132, and additional optional redistribution structures 136 along opposing sides of the core 132. Generally, the plurality of core substrates 130 provides structural support for the component package, as well as providing electrical signal routing between the integrated circuit package and the external connectors 150.

As shown in FIG. 1, the external connectors 150 can be used to physically and electrically connect the singulated package component 100 to a printed circuit board (PCB) 700. The PCB includes contacts 710 that are physically and electrically connected to the external connectors 150. In some embodiments, the singulated package component 100 has a width $W_1$ in a range from 30 to 500 millimeters (mm).

Figure 2:
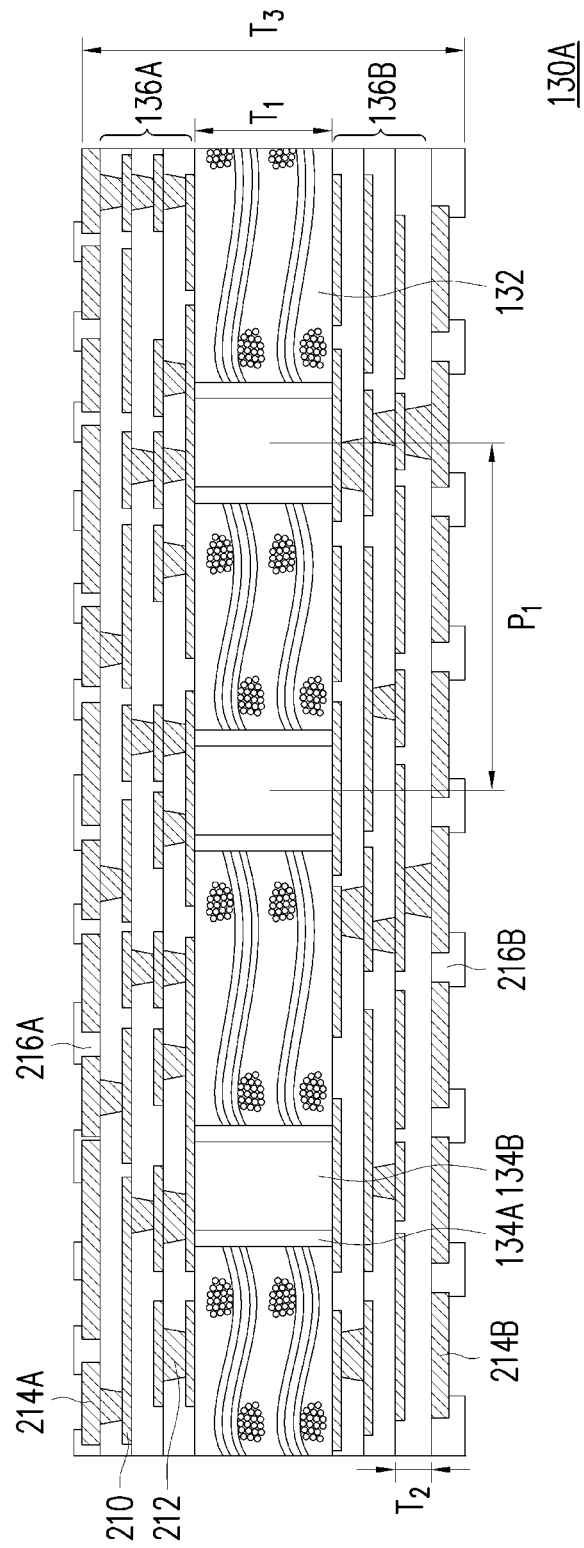

In FIG. 2, an exemplary core substrate 130A of the plurality of core substrates 130 is illustrated, for simplification. The plurality of core substrates 130 may be, e.g., an organic substrate, a ceramic substrate, a silicon substrate, or the like, and a thickness $T_1$ in a range from 30 to 2000 μm.

In some embodiments the plurality of core substrates 130 may be processed to form redistribution structures 136 on the plurality of core substrates 130. For example, the exemplary core substrate 130A includes a core 132. The core 132 may be formed of one or more layers of glass fiber, resin, filler, pre-preg, epoxy, silica filler, ABF, polyimide, molding compound, other materials, and/or combinations thereof, having a thickness $T_2$ in a range from 5 to 50 μm. In some embodiments, for example, two layers of material make up the core 132. The core 132 may be formed of organic and/or inorganic materials. In some embodiments, the core 132 includes one or more passive components (not shown) embedded inside. The core 132 may comprise other materials or components. Conductive vias 134 are formed extending through the core 132. The conductive vias 134 comprise a conductive material 134A such as copper, a copper alloy, or other conductors, and may include a barrier layer (not shown), liner (not shown), seed layer (not shown), and/or a fill material 134B, in some embodiments. The conductive vias 134 provide vertical electrical connections from one side of the core 132 to the other side of the core 132. For example, some of the conductive vias 134 are coupled between conductive features at one side of the core 132 and conductive features at an opposite side of the core 132. Holes for the conductive vias 134 may be formed using a drilling process, photolithography, a laser process, or other methods, as examples, and the holes of the conductive vias 134 are then filled or plated with conductive material. In some embodiments, the conductive vias 134 are hollow conductive through vias having centers that are filled with an insulating material. Redistribution structures 136A and 136B are formed on opposing sides of the core 132. The redistribution structures 136A and 136B are electrically coupled by the conductive vias 134, and fan-in/fan-out electrical signals. In some embodiments, the conductive vias 134 have a pitch P1 in a range from 100 to 1,500 μm.

The redistribution structures 136A and 136B each include dielectric layers, formed of ABF, pre-preg, molding film, or the like, and metallization patterns. Each respective metallization pattern has line portions 210 on and extending along a major surface of a respective dielectric layer, and has via portions 212 extending through the respective dielectric layer. Solder resists 216A and 216B and under-bump metallurgies (UBMs) 214A and 214B may be formed on the redistribution structures 136A and 136B, respectively. The redistribution structure 136A is attached to the redistribution structure 120 by the UBMs 214A through the anisotropic conductive film 180 (as shown in FIG. 1). More or fewer dielectric layers and metallization patterns may be formed in the redistribution structures 136A and 136B than shown in FIG. 2. The metal line portions 210 have a thickness in a range from 5 to 50 μm. The plurality of core substrates 130 may have a total thickness $T_3$ in a range from 200 to 3000 μm.

The plurality of core substrates 130 may include active and passive devices (not shown), or may be free from either active devices, passive devices, or both. A wide variety of devices such as transistors, capacitors, resistors, combinations of these, and the like may be used. The devices may be formed using any suitable methods.

In some embodiments, the plurality of core substrates 130 comprises between 2 and 10 complete layers of material. For example, in the embodiment shown, the exemplary core substrate 130A includes 3 top redistribution layers in redistribution structure 136B, one or more layers of substrate material in core 132, and 3 bottom redistribution layers in redistribution structure 136A. In other embodiments, the plurality of core substrates may include more or fewer redistribution layers on either side, or both sides, of the core 132.

FIGS. 3 through 7 illustrates various intermediate stages in fabricating a redistribution structure 120 (see FIG. 1), in accordance with some embodiments. The illustrations of the individual features have been simplified in FIGS. 3 through 7 for ease of illustration.

Figure 3:
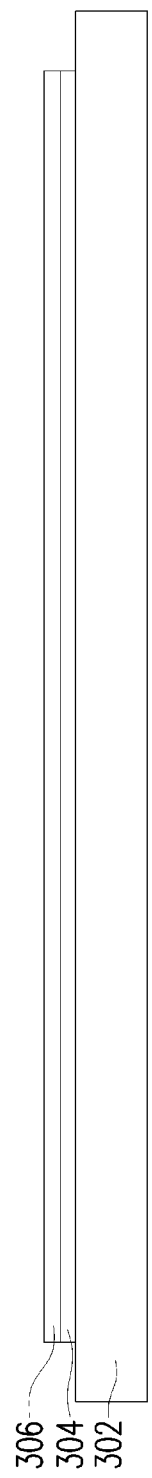

Referring first to FIG. 3, a carrier substrate 302 is provided, a release layer 304 is formed on the carrier substrate 302, and a protective layer 306 is formed over the release layer 304. The carrier substrate 302 may be a glass carrier substrate, a ceramic carrier substrate, or the like. The carrier substrate 302 may be a wafer, such that multiple redistribution structures can be formed on the carrier substrate 302 simultaneously.

The release layer 304 may be formed of a polymer-based material, which may be removed along with the carrier substrate 302 from the overlying structures that will be formed in subsequent steps. In some embodiments, the release layer 304 is an epoxy-based thermal-release material, which loses its adhesive property when heated, such as a light-to-heat-conversion (LTHC) release coating. In other embodiments, the release layer 304 may be an ultra-violet (UV) glue, which loses its adhesive property when exposed to UV lights. The release layer 304 may be dispensed as a liquid and cured, may be a laminate film laminated onto the carrier substrate 302, or may be the like. The top surface of the release layer 304 may be leveled and be substantially planar within process variations.

The protective layer 306 is deposited to provide physical protection of the features of subsequently formed layers once the carrier substrate is de-bonded, as described further below. Additionally, the protective layer 306 may provide electrical isolation and environmental protection. The protective layer 306 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like; or a combination thereof. The protective layer 306 may be formed, for example, by spin coating, lamination, chemical vapor deposition (CVD), or the like. The protective layer 306 may have an upper surface that is substantially level within process variations.

Figure 4:
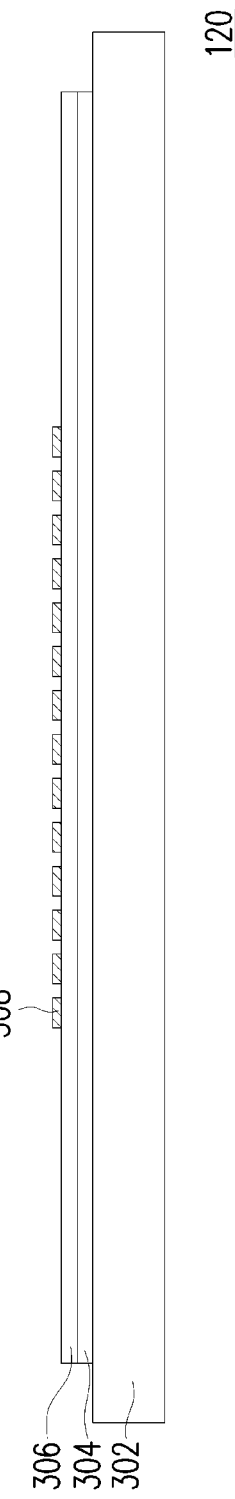

In FIG. 4, conductive lines 308 are formed on the protective layer 306. As an example to form the conductive lines 308, a seed layer (not shown) is formed over the protective layer 306. In some embodiments, the seed layer is a metal layer, which may be a single layer or a composite layer comprising a plurality of sub-layers formed of different materials. The seed layer may be, for example, a titanium layer and a copper layer over the titanium layer. The seed layer may be formed using, for example, physical vapor deposition (PVD) or the like. A photoresist (not shown) is then formed and patterned on the seed layer. The photoresist may be formed by spin coating or the like and may be exposed to light for patterning. The patterning forms openings through the photoresist to expose the seed layer, where the openings in the photoresist correspond to the conductive lines 308. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the conductive lines 308. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

In FIG. 5, the dielectric layer 312 may be formed on the conductive lines 308 and the protective layer 306. In some embodiments, the dielectric layer 312 is an encapsulant, such as a pre-preg, resin coated copper (RCC), molding compound, polyimide, photo-imageable dielectric (PID), epoxy, or the like, and may be applied by compression molding, transfer molding, lamination, coating, or the like. The encapsulant may be applied in liquid or semi-liquid form and then subsequently cured. In some embodiments, the dielectric layer 312 may be formed by spin coating, lamination, CVD, the like, or a combination thereof. In other embodiments, the dielectric layer 312 is formed of a polymer, which may be a photo-sensitive material such as PBO, BCB, or the like, that may be patterned using a lithography mask. In other embodiments, the dielectric layer 312 is formed of a nitride such as silicon nitride; an oxide such as silicon oxide, PSG, BSG, BPSG; or the like. The dielectric layer 312 is then patterned to form openings 314 exposing portions of the conductive lines 308. The patterning may be formed by an acceptable process, such as by exposing the dielectric layer 312 to light when the dielectric layer 312 is a photo-sensitive material or by etching using, for example, an anisotropic etch. If the dielectric layer 312 is a photo-sensitive material, the dielectric layer 312 can be developed after the exposure.

In FIG. 6, the metallization pattern 316 is formed over dielectric layer 312 and exposed portions of conductive lines 308. The metallization pattern 316 includes conductive elements extending along the major surface of the dielectric layer 312 and extending through the dielectric layer 312 to physically and electrically couple to an underlying conductive layer, e.g., the conductive lines 308 in this illustrated embodiment. As an example to form the metallization pattern 316, a seed layer is formed over the dielectric layer 312 and in the openings extending through the dielectric layer 312 to conductive lines 308. In some embodiments, the seed layer (not shown) is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light and developed for patterning. The patterning forms openings through the photoresist to expose the seed layer, with the pattern of the openings corresponding to the metallization pattern 316. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 316. The photoresist and portions of the seed layer on which the conductive material is not formed are removed.

The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The combination of the dielectric layer 312 and the metallization pattern 316 form the redistribution layer 320.

Figure 7:
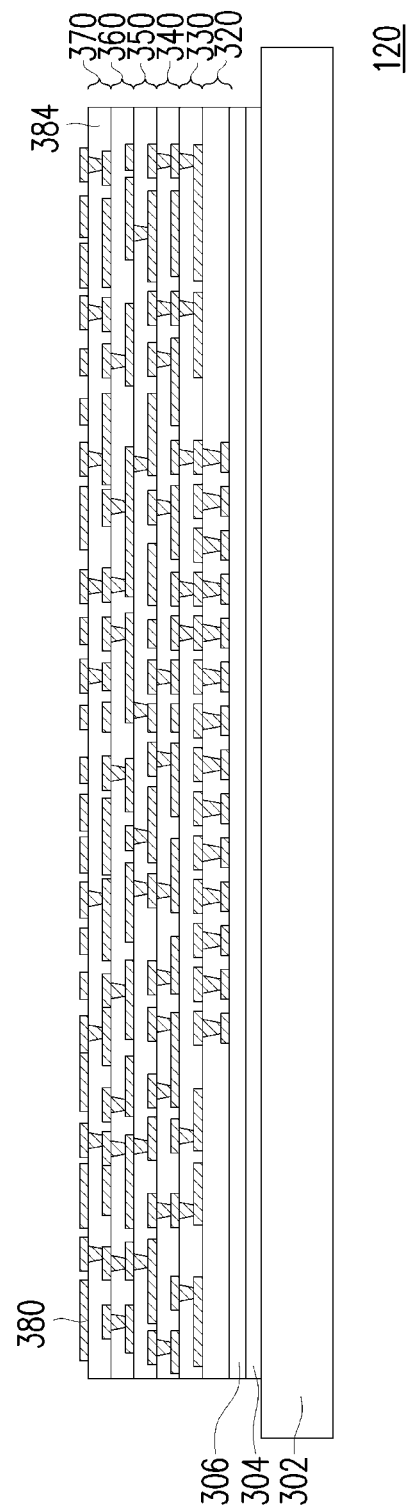

In FIG. 7, the steps and process discussed above are repeated to form additionally shown redistribution layers 330, 340, 350, 360, and 370. In some embodiments, the process described above to form the redistribution layer 320 may be repeated one or more times to provide additional routing layers as desired for a particular design, wherein metallization patterns 316 (see FIG. 6) of the redistribution layer 320 may include routing lines or redistribution lines. Six redistribution layers 320, 330, 340, 350, 360, and 370 are shown for illustrative purposes. In some embodiments more than six layers or fewer layers than six may be used. The metallization patterns for each redistribution layer 320, 330, 340, 350, 360, and 370 may each be a single pattern having line and via portions (as shown), or may have separately formed conductive lines and conductive vias. The redistribution layer 370 includes a dielectric layer 384 and metallization pattern 380.

The above description is one example of forming the redistribution layers of the redistribution structure. In other embodiments, conductive vias may be formed on and extending from the conductive lines. As an example to form such conductive vias, a photoresist is formed and patterned over the dielectric layer and the conductive lines to form openings through the photoresist to expose portions of the underlying conductive lines such that the openings in the photoresist correspond to the pattern of the conductive vias to be formed. A conductive material is then formed in the openings on the exposed portions of the exposed conductive lines and the photoresist may be removed.

A dielectric layer may then be formed on and around the conductive lines and the conductive vias in accordance with some embodiments. After formation, the dielectric layer surrounds the conductive vias and conductive lines. In some embodiments, the dielectric layer is an encapsulant, such as a pre-preg, resin coated copper (RCC), molding compound, polyimide, photo-imageable dielectric (PID), epoxy, or the like, and may be applied by compression molding, transfer molding, lamination, coating, or the like. The encapsulant may be applied in liquid or semi-liquid form and then subsequently cured. In some embodiments, the dielectric layer is formed over the carrier substrate such that the conductive lines and conductive vias are buried or covered, and a planarization process is then performed on the dielectric layer to expose the conductive vias. The topmost surfaces of the dielectric layer and conductive vias are then substantially level (e.g., planar) within process variations after the planarization process. The planarization process may be, for example, a chemical-mechanical polish (CMP). In some embodiments, the dielectric layer may comprise other materials, such as silicon oxide, silicon nitride, or the like.

In further embodiments, conductive lines may be formed on the dielectric layer and exposed portions of the conductive vias. As an example to form the conductive lines, a seed layer may be formed over the dielectric layer and exposed portions of the conductive vias. A photoresist is then formed and patterned on the seed layer to form opening corresponding to the desired positioning of the conductive lines to be formed. A conductive material is then formed in the openings on the exposed portions of the seed layer. The combination of the conductive material and underlying portions of the seed layer form the conductive lines. The photoresist and portions of the seed layer on which the conductive material is not formed are removed.

The redistribution structure 120 is shown as an example having six redistribution layers. More or fewer layers may be formed in the redistribution structure 120. If fewer layers are to be formed, steps and process discussed above may be omitted. If more layers are to be formed, steps and processes discussed above may be repeated. In some embodiments, the redistribution structure 120 includes between 1 and 20 layers.

Figure 8:
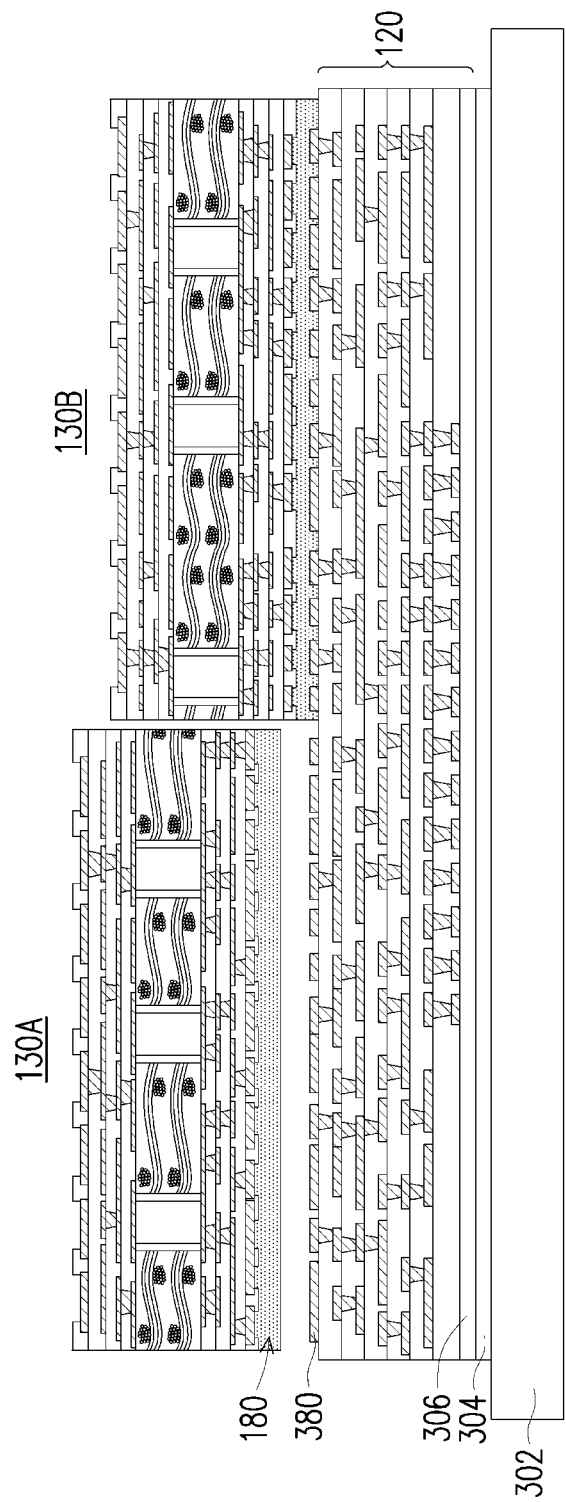

In FIG. 8, in some embodiments, the plurality of core substrates 130, in this case showing two exemplary core substrates 130A and 130B, may be placed on the redistribution structure 120 using a pick and place process or another suitable process.

Utilizing the plurality of core substrates 130 has the advantage of having the plurality of core substrates 130 being manufactured in separate processes. In addition, because the plurality of core substrates 130 is formed in separate processes, they can be tested separately so that a known good core substrate is used. For example, in some embodiments, the plurality of core substrates 130 may be individually or batch tested, validated, and/or verified prior to bonding the plurality of core substrates 130 to the redistribution structure 120.

In FIG. 8, an anisotropic conductive film 180 is used to attach the plurality of core substrates 130 to the redistribution structure 120 (as shown in FIG. 1). The anisotropic conductive film 180 may be first formed on either the plurality of core substrates 130 or the redistribution structure 120, and then the package components may be pressed to complete the bonding for the anisotropic conductive film 180. For example, in the embodiment shown in FIG. 8, the anisotropic conductive film 180 is formed on the plurality of core substrates 130 before being attached to the redistribution structure 120. The formation and pressing of the anisotropic conductive film 180 is illustrated and described with reference to FIGS. 9A, 9B, and 9C.

Figure 9A:
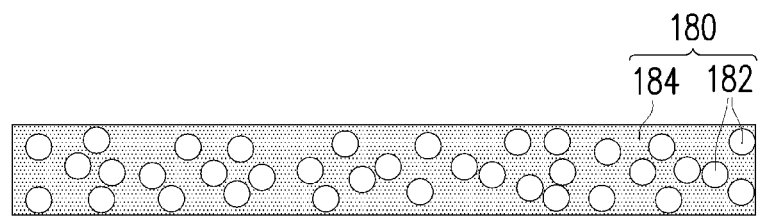
Figure 9B:
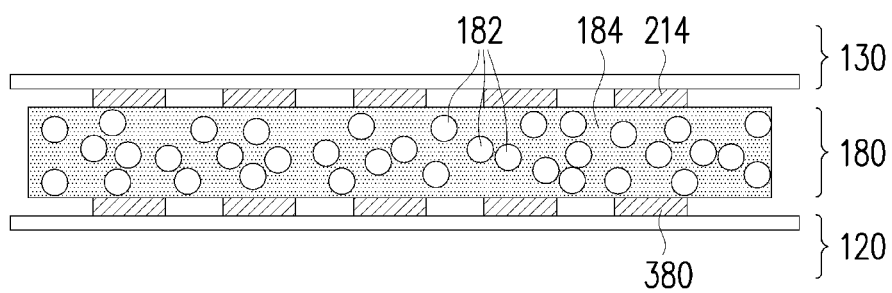
Figure 9C:
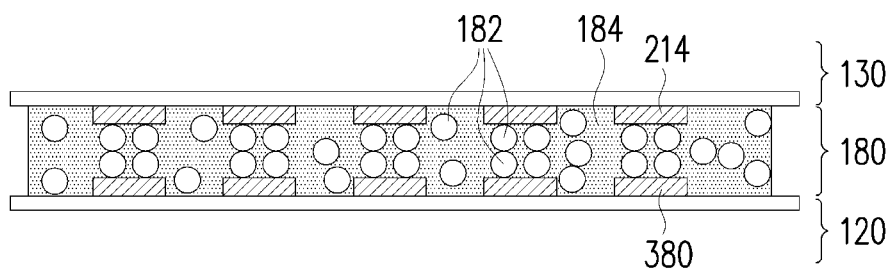

FIGS. 9A, 9B, and 9C illustrate the formation of an anisotropic conductive film 180 when it is an anisotropic conductive film. For example, FIG. 9A illustrates anisotropic conductive film 180, which includes dielectric material 184 and electrical conductive particles 182 therein. The electrical conductive particles 182 are distributed throughout the dielectric material 184, and are spaced apart from each other without forming electrical paths. The dielectric material 184 may be formed of a polymer, an epoxy, an acryl, the like, or a combination thereof. The electrical conductive particles 182 may be copper balls, aluminum balls, nickel balls, or the like, or may be metal-coated polymer balls.

Referring to FIG. 9B, the core substrate 130 and the redistribution structure 120 are pressed from opposite sides of the anisotropic conductive film 180. During the pressing, the core substrate 130 and the redistribution structure 120 may or may not be heated. The conductive pads 214 of the core substrate 130 and the metallization patterns 380 of the redistribution structure 120 are vertically aligned with a one-to-one correspondence. As a result of the pressing, the electrical conductive particles 182 between opposing conductive features 214 and 380 are pushed together and form conductive paths, which electrically connect conductive pads 214 to the corresponding metallization patterns 380. The resulting structure is shown in FIG. 9C.

Figure 10A:
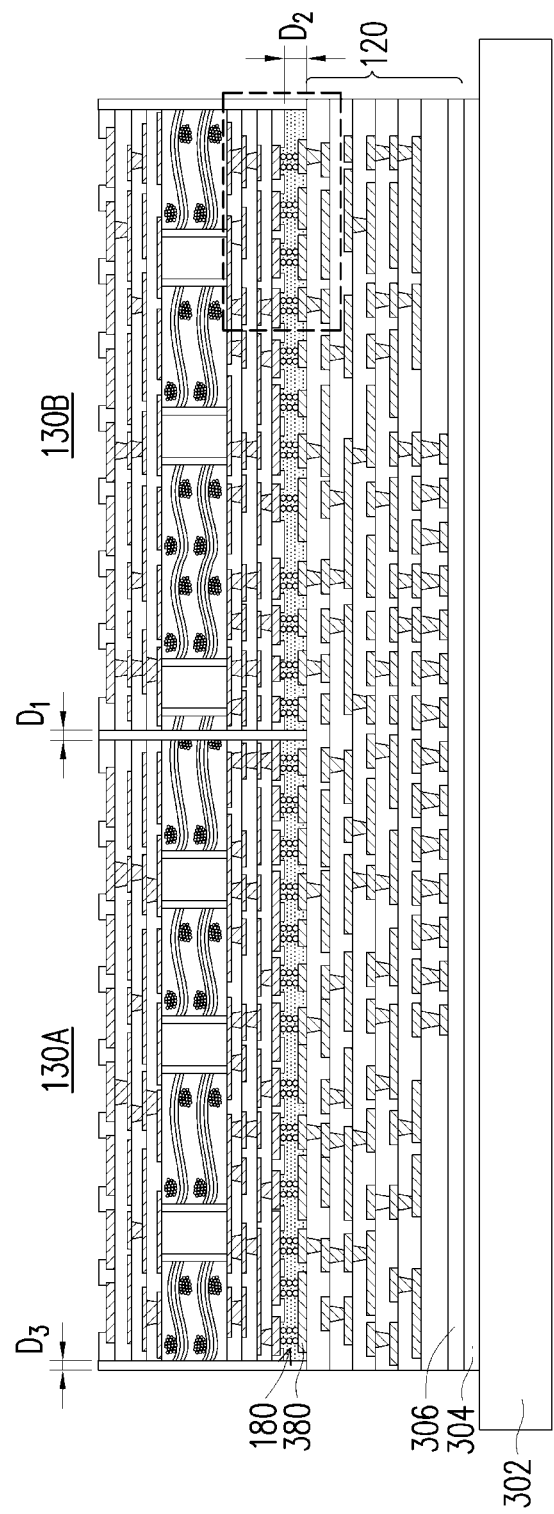
Figure 10B:
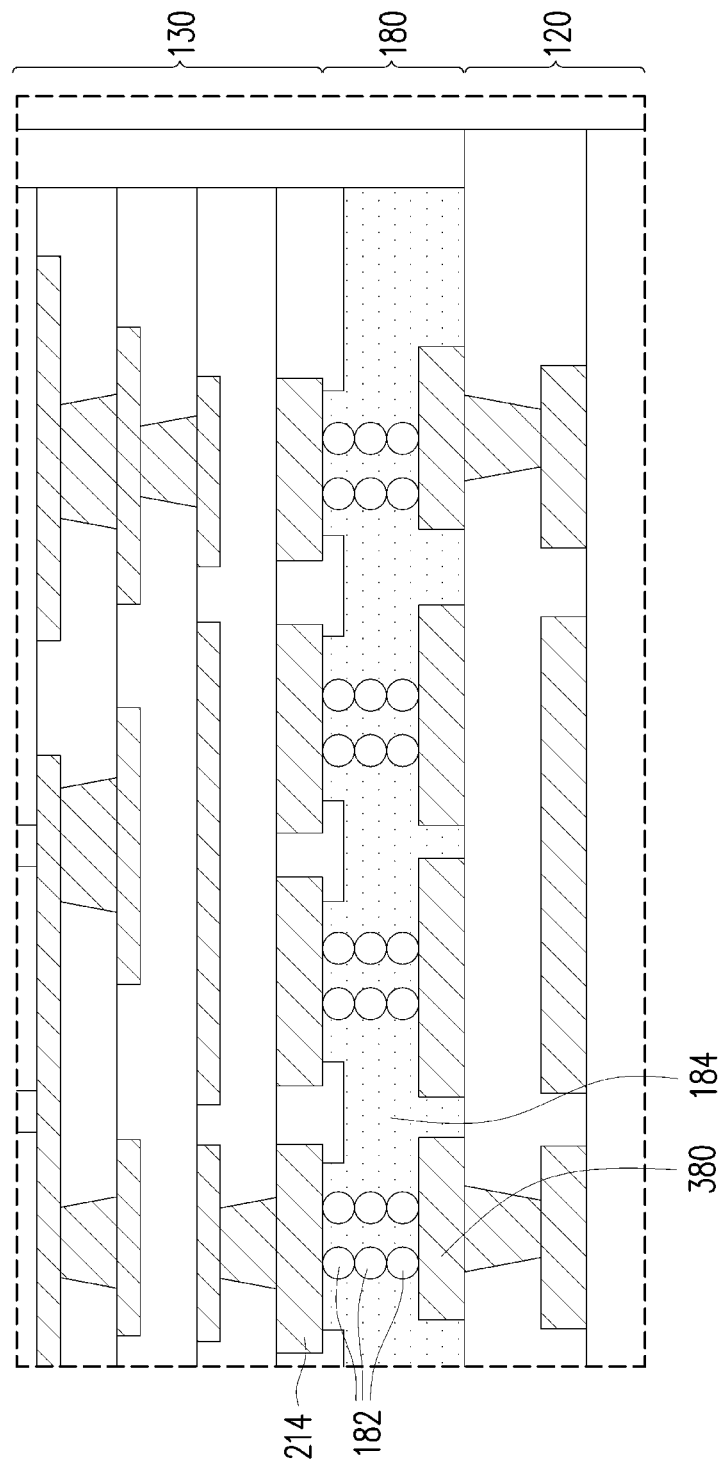

FIGS. 10A and 10B illustrate the structure after the plurality of core substrates 130 have been bonded to the redistribution structure 120 by the anisotropic conductive film 180. In FIGS. 10A and 10B, an encapsulant 190 is formed on and around the various components. After formation, the encapsulant 190 surrounds the plurality of core substrates 130, including anisotropic conductive film 180, conductive lines 380, and the upper exposed surface of dielectric layer 384. The encapsulant 190 may be formed of a molding compound, epoxy, or the like, and may be applied by compression molding, transfer molding, or the like. The encapsulant 190 may be applied in liquid or semi-liquid form and then subsequently cured. The encapsulant 190 may be formed over the carrier substrate 302 such that the plurality of core substrates 130 are buried or covered.

In some embodiments, the plurality of core substrates 130 are separated from each adjacent core substrate by a distance $D_1$ between about 40 µm and about 5000 µm. In some embodiments, a standoff height $D_2$ of 10 µm to 300 µm is utilized between the plurality of core substrates 130 and the redistribution structure 120. In some embodiments, a thickness $D_3$ of the encapsulant 190 is on the edges of the plurality of core substrates 130. The distance $D_{3\ is}$ between about 40 µm and about 5000 µm.

FIG. 10B illustrates a detailed view of a portion of the anisotropic conductive film 180 bonding the core substrate 130B to the redistribution structure 120. As shown in FIG. 10, the electrical conductive particles 182 of the anisotropic conductive film 180 form conductive paths, which electrically connect conductive pads 214 to the corresponding metallization patterns 380. Although FIG. 10B illustrates two conductive paths formed by the conductive particles 182 for each corresponding pair of UBM 214 and metallization pattern 380, there may be more conductive paths for each corresponding pair of UBM 214 and metallization pattern 380. In some embodiments, for each corresponding pair of UBM 214 and metallization pattern 380 may have six to ten conductive paths formed by the conductive particles 182.

Figure 11:
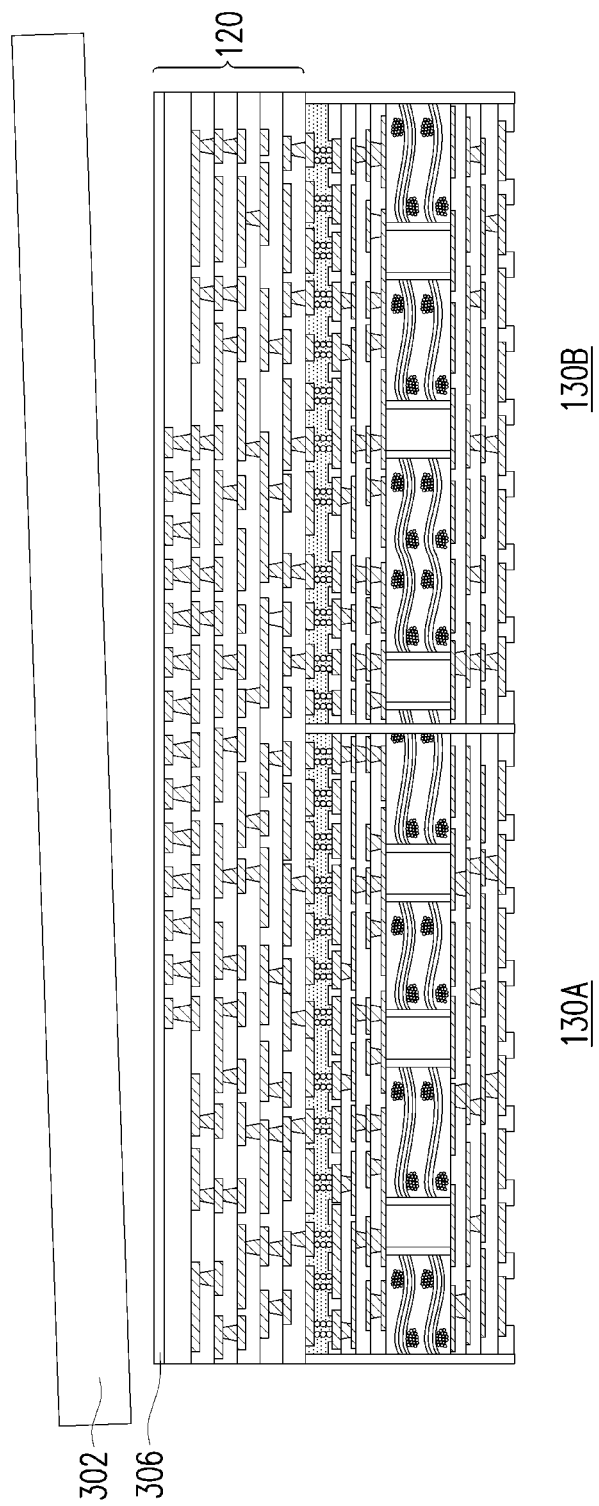

In FIG. 11, a carrier substrate de-bonding is performed to detach (or "de-bond") the carrier substrate 302 from the resulting build-up of the previously described steps comprising the plurality of core substrates 130 and the redistribution structure 120, among other structures. In accordance with some embodiments, the de-bonding includes projecting a light such as a laser light or an UV light on the release layer 304 (see FIG. 10A) so that the release layer 304 decomposes under the heat of the light and the carrier substrate 302 can be removed.

Figure 12:
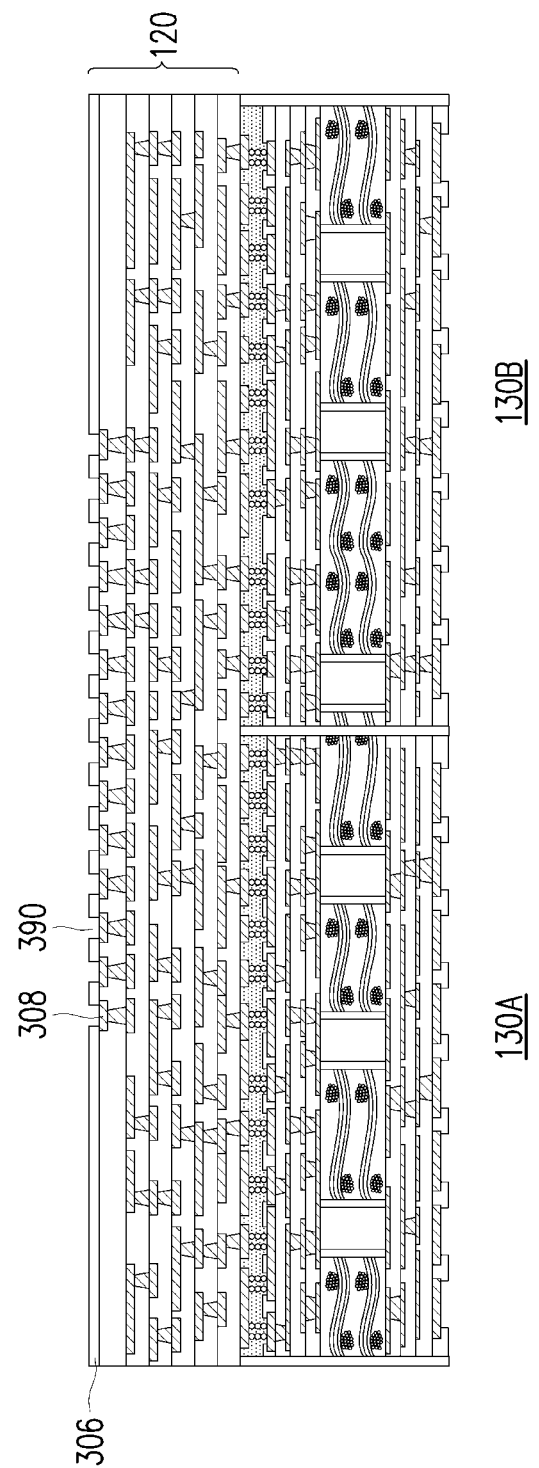

In FIG. 12 openings 390 are formed in the protective layer 306 of the redistribution structure 120, exposing the conductive lines 308. The openings 390 may be formed by etching, a drilling process such as laser drilling, mechanical drilling, or the like. The patterning forms openings exposing portions of the conductive lines 308. The patterning may be by an acceptable process, such as by exposing and developing the protective layer 306 to light when the protective layer 306 is a photosensitive material or by etching using, for example, an anisotropic etch when using a non photosensitive material such as silicon oxide, silicon nitride, or the like.

Conductive connectors 170 may be used to bond the redistribution structure 120 to an integrated circuit package 110 (see FIG. 14) and may be first formed on either the integrated circuit package 110 or the redistribution structure 120, and then reflowed to complete the bond. For example, in the embodiment shown in FIG. 13, conductive connectors 170 are first formed in the openings 390 (see FIG. 12) coupled to the exposed conductive lines 308. The conductive connectors 170 may be ball grid array (BGA) connectors, solder balls (as shown), metal pillars, controlled collapse chip connection (C4) bumps, micro bumps, electroless nickel-electroless palladium-immersion gold technique (ENEPIG) formed bumps, or the like. The conductive connectors 170 may include a conductive material such as solder, copper, aluminum, gold, nickel, silver, palladium, tin, the like, or a combination thereof. In some embodiments, the conductive connectors 170 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 170 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 14:
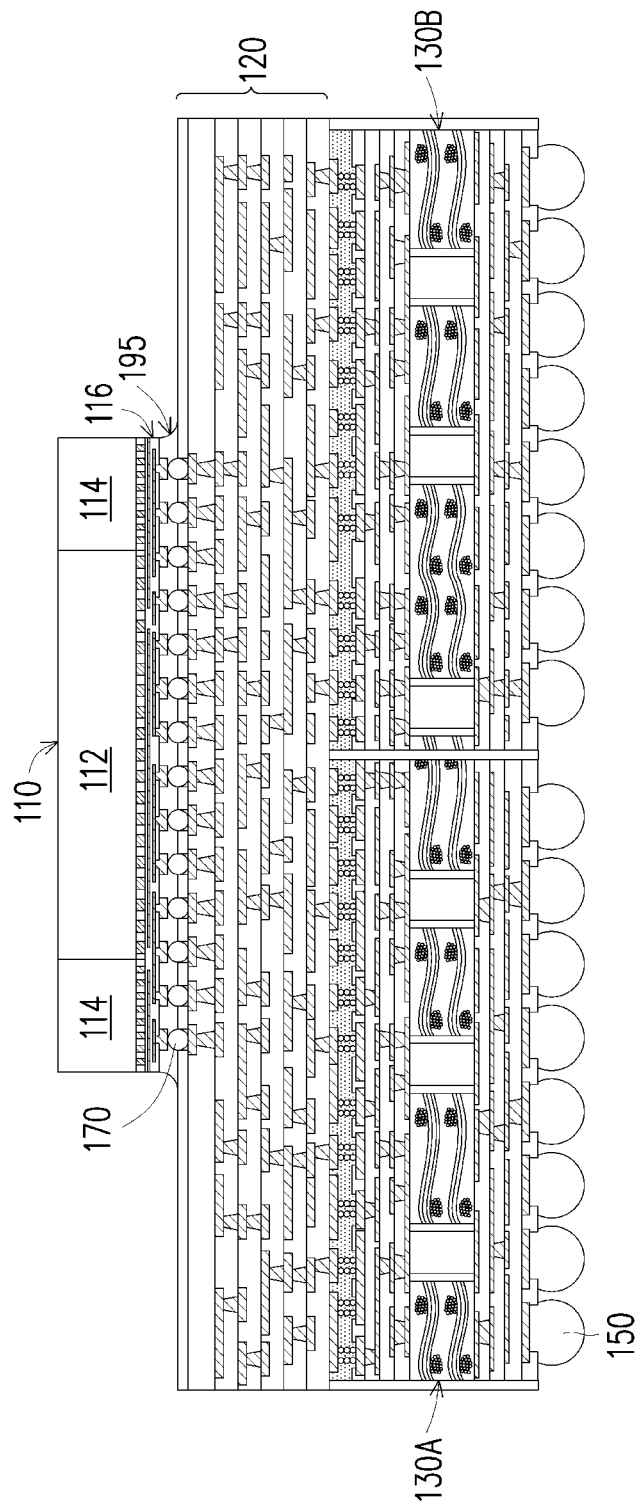

As shown in FIG. 14, the integrated circuit package 110 may be attached to the to the redistribution structure 120 through the conductive connectors 170. The conductive connectors 170 attach the integrated circuit package 110 to the conductive lines 308 of the redistribution structure 120. Attaching the integrated circuit package 110 may include placing the integrated circuit package 110 on the conductive connectors 170 and reflowing the conductive connectors 170 to physically and electrically couple the integrated circuit package 110 and the redistribution structure 120. The integrated circuit package 110 may include a logic die 112 and one or more I/O dies 114 for interfacing with the logic die 112. The number, types, and arrangement of dies included in integrated circuit package is not limiting, and alternate dies and arrangements may be utilized in different embodiments. Multiple integrated circuit packages may be included by repeating the steps described above, in conjunction with the metallization to provide electrical connection to the multiple integrated circuits packages.

In some embodiments, an underfill 195 is formed surrounding the conductive connectors 170 and the integrated circuit package 110. The underfill 195 may reduce stress and protect the joints resulting from the reflowing of the conductive connectors 170. The underfill 195 may be formed by a capillary flow process after the integrated circuit package 110 is attached, or may be formed by a suitable deposition method. In some embodiments, a single layer of underfill 195 is formed beneath multiple adjacent devices, and further subsequent underfills (not shown) may be formed beneath and/or around additional devices placed on top of the redistribution structure 120.

As shown in FIG. 14, the external connectors 150 are then mounted to the UBMs 214B of the plurality of core substrates 130. The external connectors 150 may be BGA connectors (as shown), solder balls, metal pillars, controlled collapse chip connection (C4) bumps, micro bumps, or the like. The external connectors 150 may include a conductive material such as solder, copper, aluminum, gold, nickel, silver, palladium, tin, the like, or a combination thereof. In some embodiments, the external connectors 150 are formed by initially forming a layer of reflowable material on the UBMs 214B through evaporation, electroplating, printing, solder transfer, ball placement, or the like. Once a layer of reflowable material has been formed on the UBMs 214B, a reflow may be performed in order to shape the material into the desired bump shapes.

Figure 15:
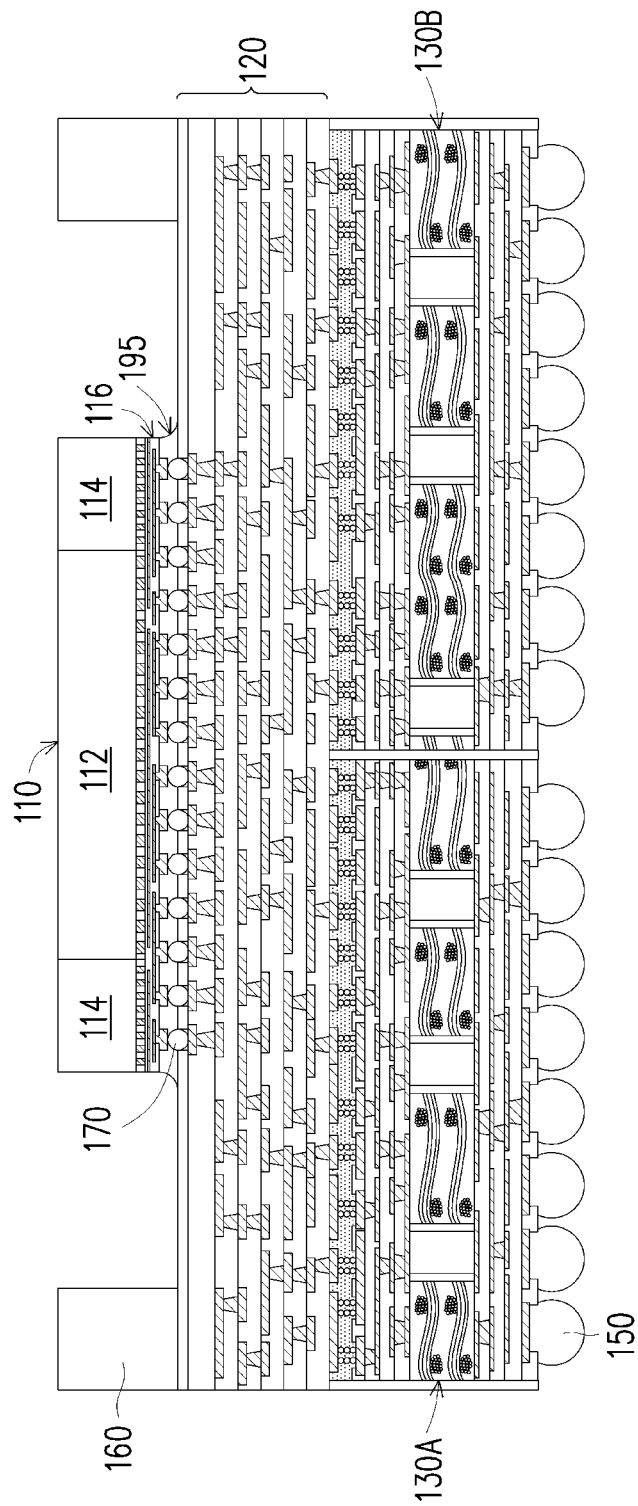

In FIG. 15, a protective ring 160 may be mounted to the top of the singulated package component 100, encircling the integrated circuit package 110. In some embodiments the protective ring may be added to provide additional rigidity to the singulated package component and protect the mounted integrated circuit package from physical bumping and knocks that may damage the electrical connection between the integrated circuit package 110 and the redistribution structure 120, or the integrated circuit package 110 itself. As illustrated in FIG. 1, the external connectors 150 can be connected to the PCB 700.

Figure 16:
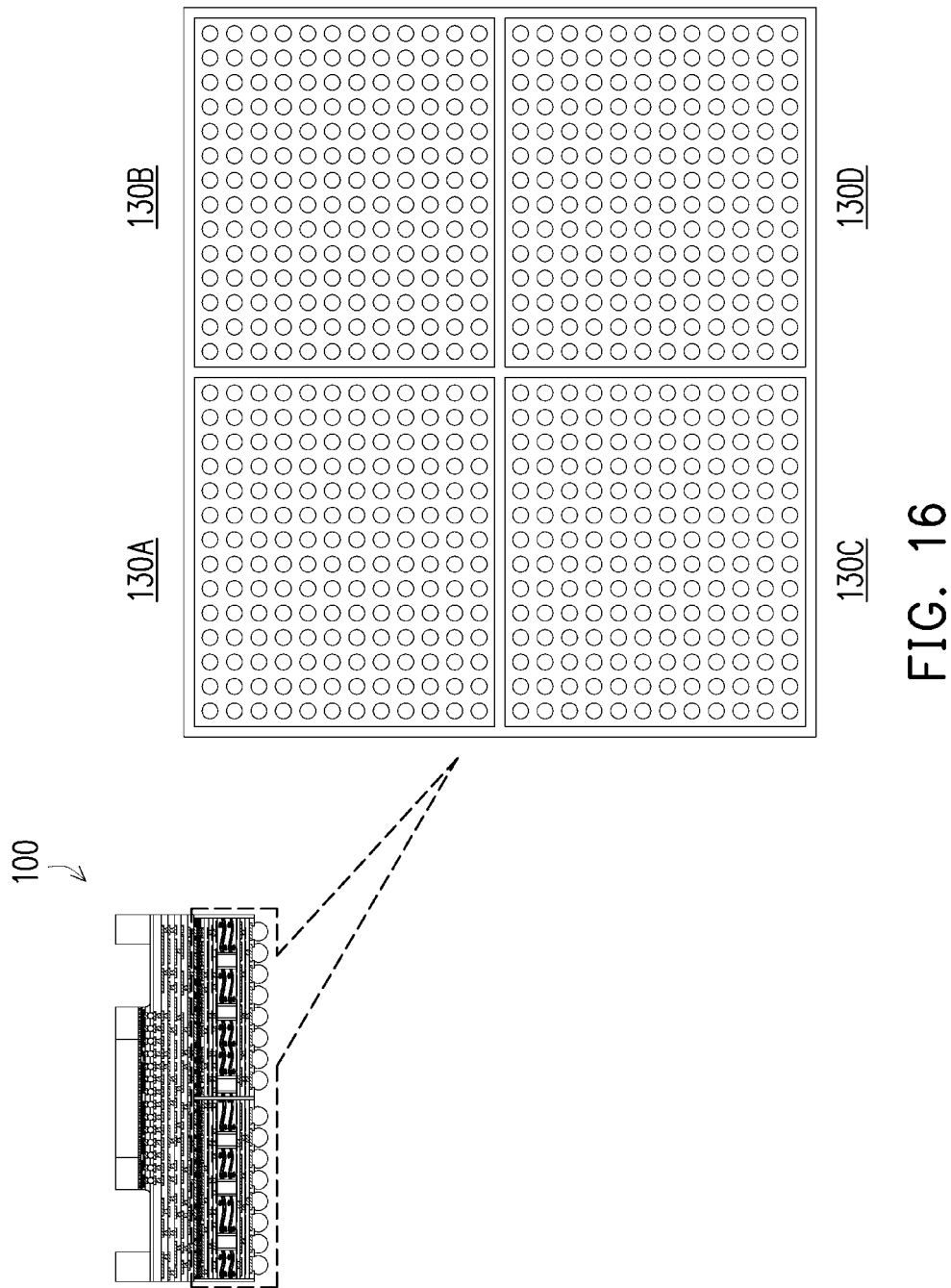
FIG. 16 illustrates a cross-sectional versus a planar view of the layout of multiple core substrates in a package component in accordance with some embodiments.

The plurality of core substrates 130 can be expanded in a two dimensional grid. For example, as shown in FIG. 16, the singulated package component 100 comprises four core substrates 130A, 130B, 130C, and 130D arranged in a 2×2 array. More or fewer core substrates may be included, to achieve larger or smaller singulated package components 100 in varying shapes and sizes, while still achieving stable BGA ball coplanarity across a number of independent core substrates and core substrate warpage.

Figure 17A:
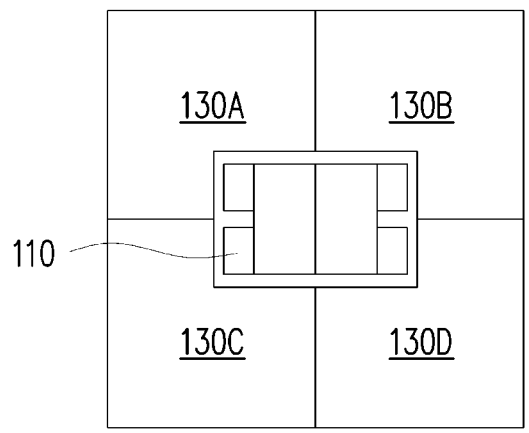
FIGS. 17A, 17B, and 17C illustrate planar views of layouts of multiple core substrates in package components in accordance with some embodiments.
Figure 17B:
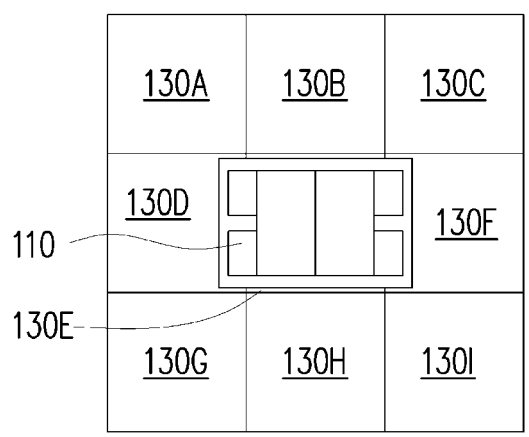
Figure 17C:
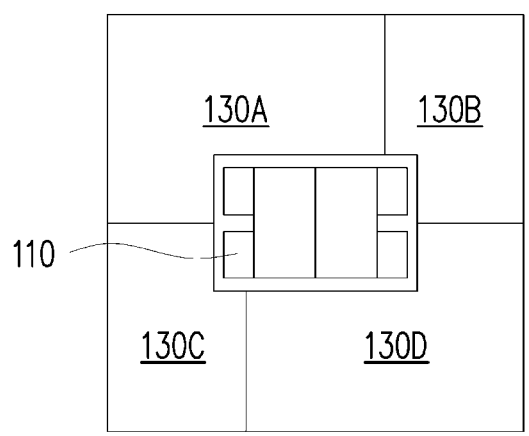

FIGS. 17A, 17B, and 17C illustrate various embodiments of two-dimensional grids of the plurality of core substrates 130. FIG. 17A illustrates a grid with four core substrates 130A, 130B, 130C, and 130D with each core substrate having a similar top surface area. FIG. 17B illustrates a grid with nine core substrates 130A, 130B, 130C, 130D, 130E, 130F, 130G, 130H, and 130I with each core substrate having a similar top surface area. FIG. 17C illustrates a grid with four core substrates 130A, 130B, 130C, and 130D with the core substrates have different top surface areas. The various configurations of core substrates as disclosed in FIGS. 17A-17C are applicable to any of the disclosed embodiments.

Figure 18:
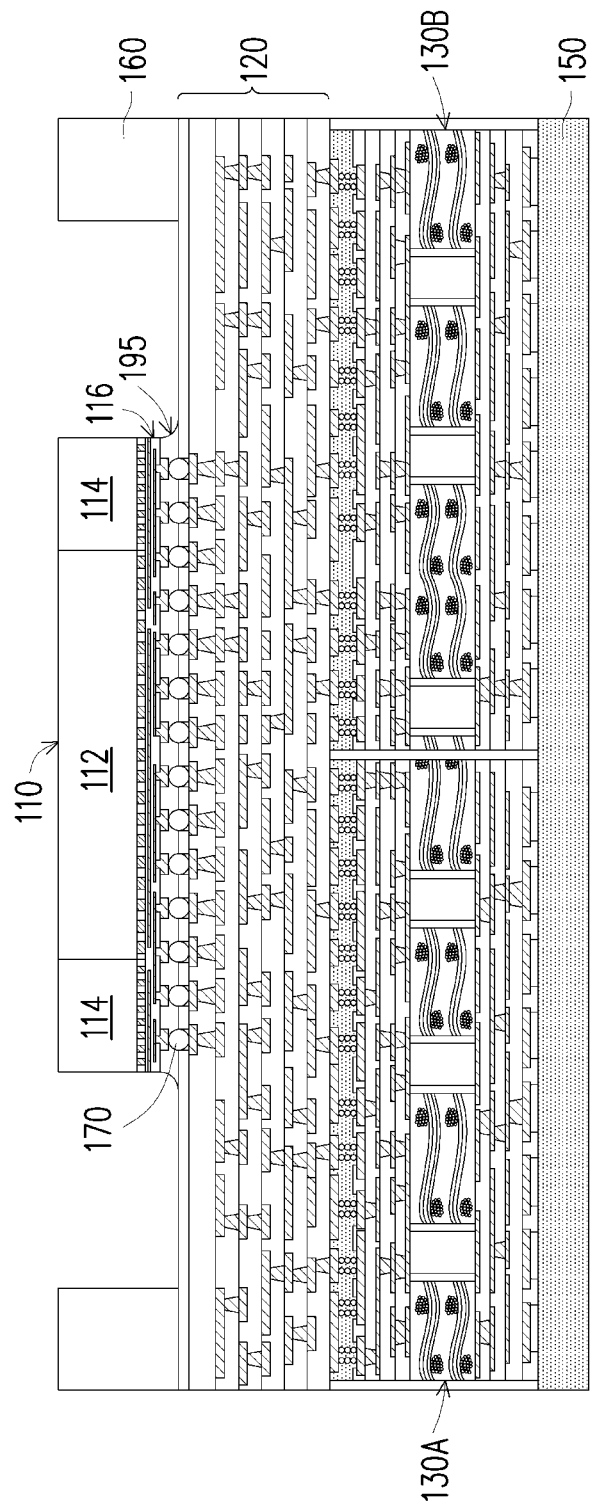
FIG. 18 illustrates a cross-sectional view of an intermediate step during a process for forming a package component in accordance with some embodiments.

FIG. 18 illustrates a package structure in accordance with some embodiments. This embodiment is similar to embodiment in FIGS. 1-15 except that this embodiment replaces the external connectors 150 with an anisotropic conductive film 150. Details regarding this embodiment that are similar to those for the previously described embodiment will not be repeated herein.

In this embodiment, the conductive particles of the anisotropic conductive film 150 will form conductive paths between the plurality of core substrates 130 and an attached structure, such as the printed circuit board 700 illustrated in FIG. 1. The anisotropic conductive film 150 as disclosed in FIG. 18 is applicable to any of the disclosed embodiments.

Figure 19:
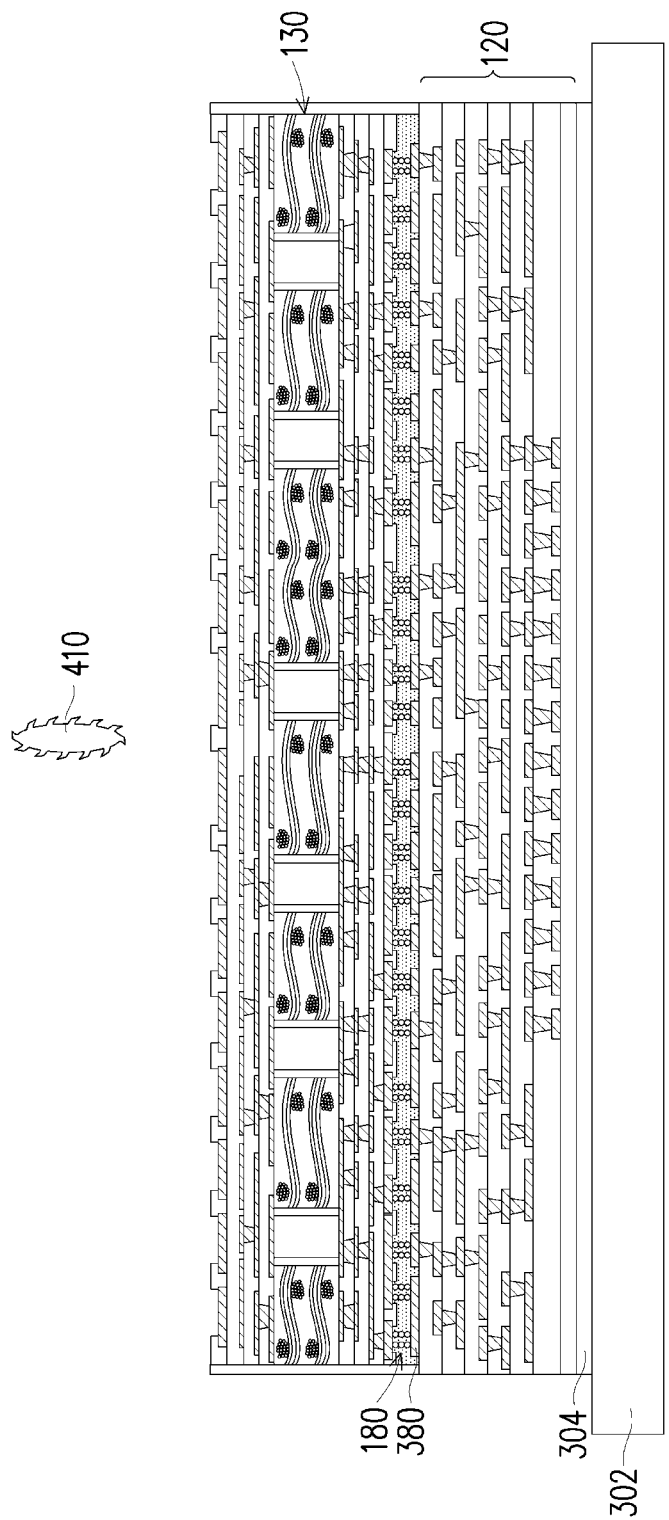
FIGS. 19 through 20 illustrate cross-sectional views of intermediate steps during a process for forming a package component in accordance with some embodiments.
Figure 20:
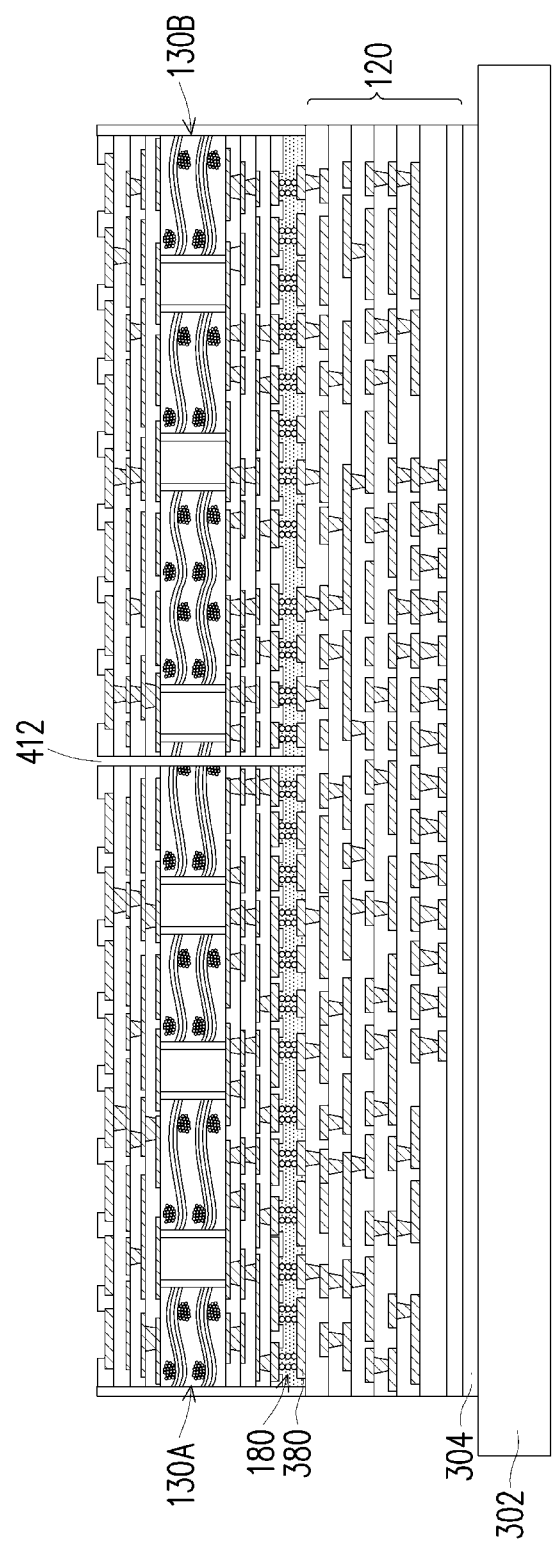

FIGS. 19 through 20 illustrate intermediate steps in forming a package structure in accordance with some embodiments. This embodiment is similar to embodiment in FIGS. 1-15 except that this embodiment attaches a single core substrate 130 to the redistribution structure 120 and then singulates the core substrate into a plurality of core substrates 130. Details regarding this embodiment that are similar to those for the previously described embodiment will not be repeated herein.

FIG. 19 is at a similar intermediate stage in the process as FIGS. 10A and 10B and the description is not repeated herein. A difference between FIG. 19 is that the core substrate 130 is a continuous structure and is not a plurality of core substrates in FIG. 19. In FIG. 19, a singulation process 410 is performed on the core substrate 130 to form the plurality of core substrates 130. In some embodiments, the singulation process 410 includes a sawing process, a laser process, the like, or a combination thereof.

FIG. 20 illustrates the structure after the singulation process 410 is performed. The singulation process 410 forms a gap 412 between the singulated portions 130A and 130B of the core substrate. In some embodiments, the singulation process 410 only singulates the core substrate 130 but not the redistribution structure 120. In some embodiments, the singulation process 410 does not singulate the anisotropic conductive film 180 and in other embodiments the singulation process 410 does singulate the anisotropic conductive film 180. After the singulation process, the gap 412 may be filled by encapsulant. The singulation process as disclosed in FIGS. 19 and 20 are applicable to any of the disclosed embodiments.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 13:
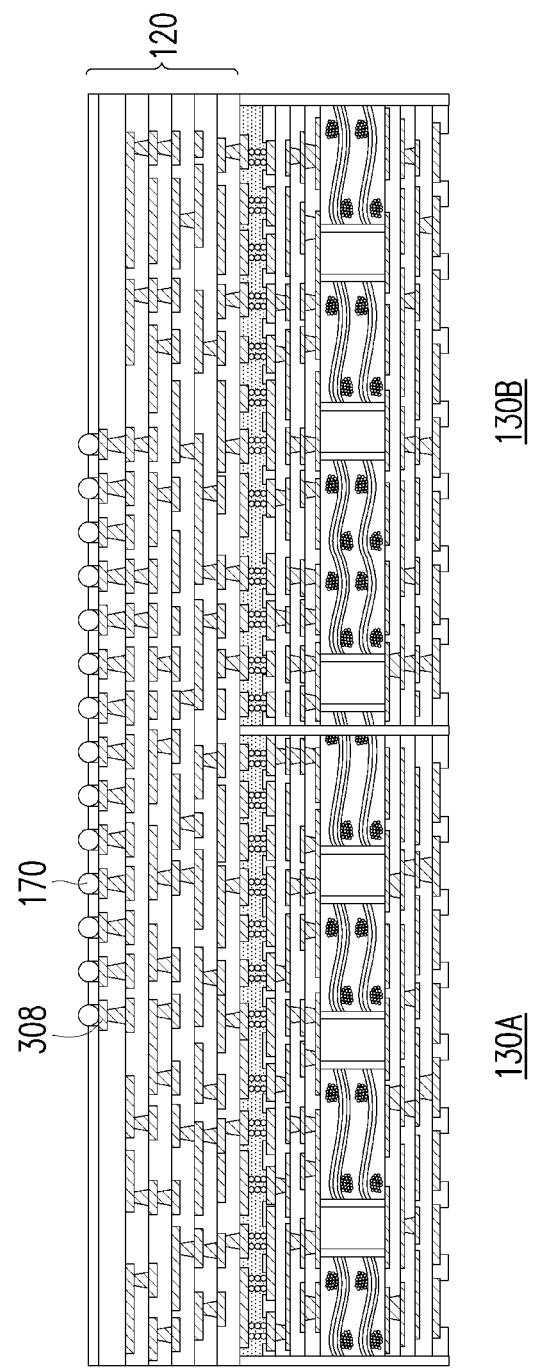
Figure 21:
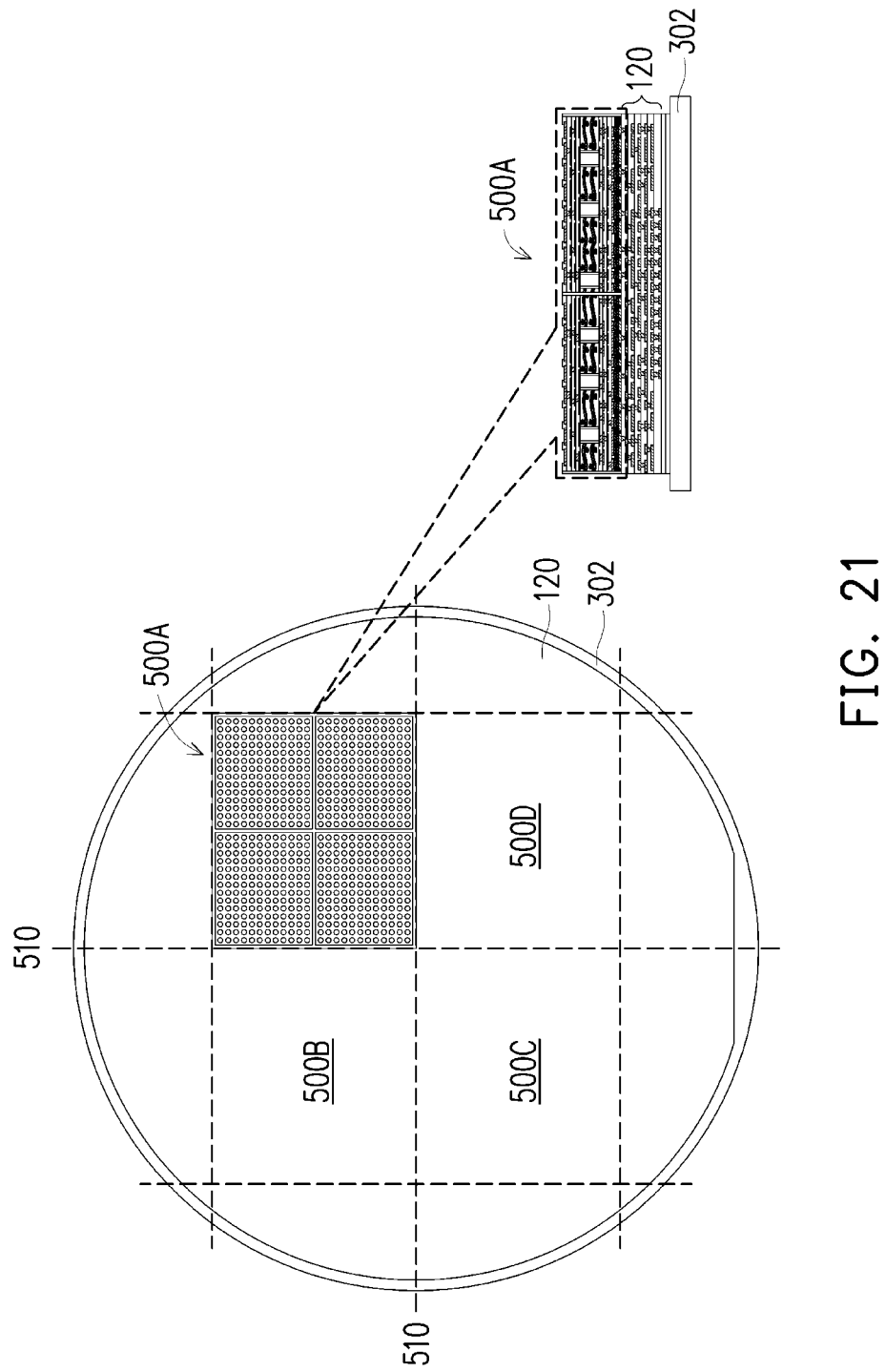
FIG. 21 illustrates a planar view of the layout of package regions on a wafer substrate in accordance with some embodiments.

Additionally, redistribution structure 120 may be larger and include multiple package regions that can later be singulated by cutting through scribe lines to produce multiple independent singulated package components from a single substrate. For example, FIG. 21 illustrates the redistribution structure 120 having a circular wafer shape with multiple package regions. In the embodiment shown, four package regions 500A, 500B, 500C, and 500D are included on the wafer allowing for four final package components to be fabricated on a single wafer and later singulated. For example, individual package components may be singulated after forming the conductive connectors 170 as shown in FIG. 13, after incorporating the integrated circuit package 110 as shown in FIG. 14, or after the ring 160 is installed as shown in FIG. 15. Fewer or more package regions may be utilized on a single wafer in other embodiments. The individual package components may be singulated, for example, by sawing through the redistribution structure 120 and the molding compound 190 between core substrates 130, such that after singulation, the outside edges of the redistribution structure 120 and molding compound 190 are coplanar along the singulation lines. The individual package regions are singulated by sawing along lines 510 and around the outer edges of package regions 101A, 101B, 101C, and 101D.

Figure 22:
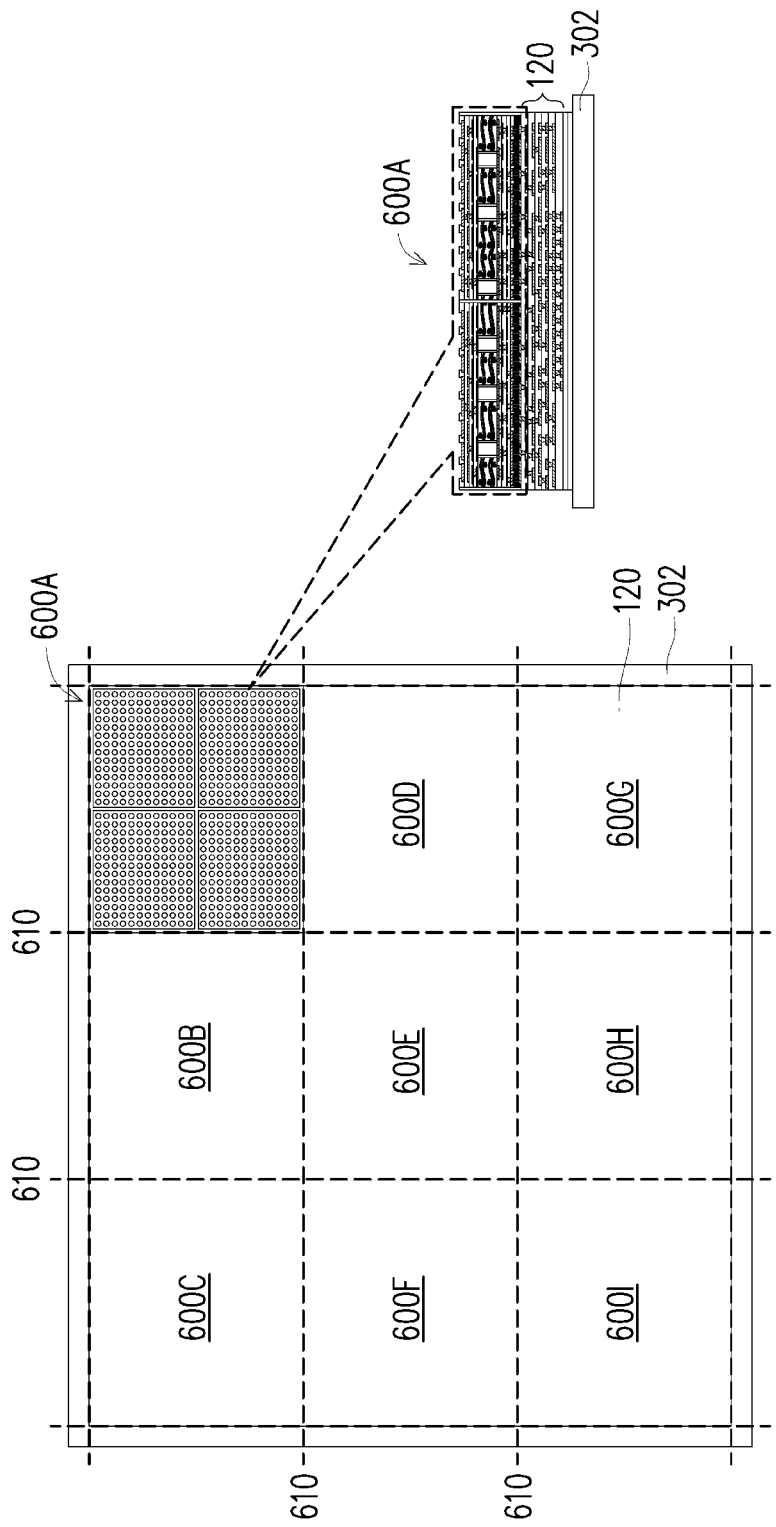
FIG. 22 illustrates a planar view of the layout of package regions on a panel substrate in accordance with some embodiments.

FIG. 22 illustrates the redistribution structure 120 being manufactured using a panel form fabrication process with multiple package regions. In the embodiment shown, nine package regions 600A through 600I are included on the panel substrate allowing for nine final package components to be fabricated on a single panel and later singulated. Fewer or more package regions may be utilized on a single panel in other embodiments. The individual package regions are singulated by sawing along lines 610 and around the perimeter of package regions 600A through 600I.

Embodiments may achieve advantages. In accordance with some embodiments, a package component is formed having one or more integrated circuit dies. An anisotropic conductive film is formed on the bottom of two or more discrete core substrates. The two or more core substrates are attached, via the anisotropic conductive film, to a redistribution structure build up. Over molding is applied to the RDL build up and two or more core substrates. The one or more integrated circuit dies are attached to the opposite side of the RDL build up as the core substrates, and BGA ball mounting may be performed on the exposed side of the core substrates. By using processes such as those described herein, it is possible to mitigate warpage issues and improve the cost and throughput in a system on integrated substrate (SoIS) approach. Further, board level reliability can be enhanced, core substrate costs mitigated, higher yield substrates recognized due to the ability to integrate multiple smaller core substrates, and more control is provided over the warpage of the package due to the reduced coefficient of thermal expansion (CTE) mismatch provided by the anisotropic conductive film.

In an embodiment, a method for manufacturing a semiconductor device includes forming a redistribution structure on a carrier substrate. The method also includes connecting a plurality of core substrates physically and electrically to the redistribution structure with a first anisotropic conductive film, the first anisotropic conductive film including a dielectric material and conductive particles. The method also includes pressing the plurality of core substrates and the redistribution structure together to form conductive paths between the plurality of core substrates and the redistribution structure with the conductive particles in the first anisotropic conductive film. The method also includes encapsulating the plurality of core substrates with an encapsulant. The method also includes and attaching an integrated circuit package to the redistribution structure, the redistribution structure being between the integrated circuit package and the plurality of core substrates, the integrated circuit package laterally overlapping a first core substrate and a second core substrate of the plurality of core substrates.

Embodiments may include one or more of the following features. The method where the encapsulant extends along sidewalls of the plurality of core substrates, the encapsulant being between adjacent ones of the plurality of core substrates. The conductive particles of the first anisotropic conductive film include copper balls, aluminum balls, nickel balls, or metal-coated polymer balls. Before pressing the plurality of core substrates and the redistribution structure together, the conductive particles of the first anisotropic conductive film did not form conductive paths between the plurality of core substrates and the redistribution structure. The method further including at a same time as the pressing the plurality of core substrates and the redistribution structure together, applying heat to the plurality of core substrates and the redistribution structure. The method further including attaching a protective ring to the redistribution structure, the protective ring encircling the integrated circuit package. The method further including forming a second anisotropic conductive film on the plurality of core substrates, the plurality of core substrates being between the first and second anisotropic conductive films, the second anisotropic conductive film including a dielectric material and conductive particles, attaching a printed circuit board to the plurality of core substrates with the second anisotropic conductive film, and pressing the plurality of core substrates and the printed circuit board together to form conductive paths between the plurality of core substrates and the printed circuit board with the conductive particles in the second anisotropic conductive film. The encapsulant physically contacts the plurality of core substrates and the first anisotropic conductive film.

In an embodiment, a semiconductor device includes a redistribution structure. The semiconductor device also includes a plurality of core substrates attached to the redistribution structure using a first anisotropic conductive film. The semiconductor device also includes a molding layer encapsulating the plurality of core substrates, the molding layer extending along sidewalls of the plurality of core substrates. The semiconductor device also includes an integrated circuit package attached to the redistribution structure, the redistribution structure being between the integrated circuit package and the plurality of core substrates, the integrated circuit package laterally overlapping a first core substrate and a second core substrate of the plurality of core substrates.

Embodiments may include one or more of the following features. The semiconductor device where the first anisotropic conductive film includes a dielectric material and conductive particles, the conductive particles of the first anisotropic conductive film forming conductive paths between the redistribution structure and the plurality of core substrates, the conductive particles of the first anisotropic conductive film include copper balls, aluminum balls, nickel balls, or metal-coated polymer balls. The semiconductor device further including a protective ring attached to the redistribution structure, the protective ring encircling the integrated circuit package. The semiconductor device further including a second anisotropic conductive film on the plurality of core substrates, the plurality of core substrates being between the first and second anisotropic conductive films, the second anisotropic conductive film including a dielectric material and conductive particles, and printed circuit board attached to the plurality of core substrates with the second anisotropic conductive film, the conductive particles of the second anisotropic conductive film forming conductive paths between the printed circuit board and the plurality of core substrates. The molding layer physically contacts the plurality of core substrates and the first anisotropic conductive film. The redistribution structure includes a first metallization pattern, a first core substrate of the plurality of core substrates includes a first under bump metallization (UBM), the first metallization pattern being electrically connected to the first UBM by a conductive path formed by the conductive particles of the first anisotropic conductive film. The first metallization pattern is electrically connected to the first UBM by more than one conductive path formed by the conductive particles of the first anisotropic conductive film.

In an embodiment, a semiconductor device includes a first redistribution structure, the first redistribution structure having a first side and a second side. The semiconductor device also includes a plurality of core substrates, each core substrate of the plurality of core substrates having a first side and a second side, the first side of each of the plurality of core substrates attached to the first side of the first redistribution structure using a first anisotropic conductive film. The semiconductor device also includes a molding layer encapsulating each core substrate of the plurality of core substrates. The semiconductor device also includes an integrated circuit package attached to the second side of the first redistribution structure by first conductive connectors.

Embodiments may include one or more of the following features. The semiconductor device further including a protective ring attached to the second side of the first redistribution structure encircling the integrated circuit package. The first side of the first redistribution structure includes a first metallization pattern, the first side of a first core substrate of the plurality of core substrates includes a first under bump metallization (UBM), the first metallization pattern being electrically connected to the first UBM by more than one conductive path formed by the conductive particles of the first anisotropic conductive film. The first anisotropic conductive film includes a dielectric material and conductive particles, the conductive particles of the first anisotropic conductive film forming conductive paths between the first side of the first redistribution structure and the first sides of the plurality of core substrates, the conductive particles of the first anisotropic conductive film include copper balls, aluminum balls, nickel balls, or metal-coated polymer balls. The molding layer extends along sidewalls of each of the plurality of core substrates and physically contacts the first anisotropic conductive film.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, the method comprising:
   forming a first redistribution structure on a carrier substrate;
   after forming the first redistribution structure on the carrier substrate, connecting a plurality of core substrates to the first redistribution structure on the carrier substrate, each core substrate of the plurality of core substrates having a first side and a second side, each of the first sides having a second redistribution structure, each of the second sides having a third redistribution structure, the second redistribution structures of the plurality of core substrates being physically and electrically connected to the first redistribution structure with a first anisotropic conductive film, the first anisotropic conductive film comprising a dielectric material and conductive particles, the first redistribution structure being between the carrier substrate and the plurality of core substrates;
   pressing the plurality of core substrates and the first redistribution structure together to form conductive paths between the second redistribution structures of the plurality of core substrates and the first redistribution structure with the conductive particles in the first anisotropic conductive film;
   after pressing the plurality of core substrates and the first redistribution structure together, encapsulating the plurality of core substrates with an encapsulant;
   after encapsulating the plurality of core substrates, removing the carrier substrate;
   after removing the carrier substrate, attaching an integrated circuit package to the first redistribution structure, the first redistribution structure being between the integrated circuit package and the plurality of core substrates, the integrated circuit package laterally overlapping a first core substrate and a second core substrate of the plurality of core substrates; and
   attaching the third redistribution structures of the plurality of core substrates to a printed circuit board with a first set of solder connectors, the first set of solder connectors being directly coupled to both the third redistribution structures of the plurality of core substrates and the printed circuit board.

2. The method of claim 1, wherein the encapsulant extends along sidewalls of the plurality of core substrates, the encapsulant being between adjacent ones of the plurality of core substrates.

3. The method of claim 1, wherein the conductive particles of the first anisotropic conductive film comprise copper balls, aluminum balls, nickel balls, or metal-coated polymer balls.

4. The method of claim 1, wherein before pressing the plurality of core substrates and the first redistribution structure together, the conductive particles of the first anisotropic conductive film did not form conductive paths between the plurality of core substrates and the first redistribution structure.

5. The method of claim 1 further comprising:
   at a same time as the pressing the plurality of core substrates and the first redistribution structure together, applying heat to the plurality of core substrates and the first redistribution structure.

6. The method of claim 1 further comprising:
   attaching a protective ring to the first redistribution structure, the protective ring encircling the integrated circuit package.

7. The method of claim 1, wherein the encapsulant physically contacts the plurality of core substrates and the first anisotropic conductive film.

8. A semiconductor device, comprising:
   a first redistribution structure;
   a plurality of core substrates attached to the first redistribution structure using a first anisotropic conductive film, each core substrate of the plurality of core substrates having a first side and a second side, each of the first sides having a second redistribution structure, each of the second sides having a third redistribution structure, each of the plurality of core substrates having a through via extending from the second redistribution structure to the third redistribution structure, the first sides of the plurality of core substrates facing the first redistribution structure;
   a molding layer encapsulating the plurality of core substrates, the molding layer extending along and physically contacting sidewalls of the plurality of core substrates and the first anisotropic conductive film, the molding layer physically contacting the first redistribution structure, the molding layer being free from though vias; and
   an integrated circuit package attached to the first redistribution structure, the first redistribution structure being between the integrated circuit package and the plurality of core substrates, the integrated circuit package laterally overlapping a first core substrate and a second core substrate of the plurality of core substrates.

9. The semiconductor device of claim 8, wherein the first anisotropic conductive film comprises a dielectric material and conductive particles, the conductive particles of the first anisotropic conductive film forming conductive paths between the first redistribution structure and the plurality of core substrates, the conductive particles of the first anisotropic conductive film comprise copper balls, aluminum balls, nickel balls, or metal-coated polymer balls.

10. The semiconductor device of claim 8 further comprising:
a protective ring attached to the first redistribution structure, the protective ring encircling the integrated circuit package.

11. The semiconductor device of claim 8 further comprising:
a second anisotropic conductive film on the plurality of core substrates, the plurality of core substrates being between the first and second anisotropic conductive films, the second anisotropic conductive film comprising a dielectric material and conductive particles; and
a printed circuit board attached to the plurality of core substrates with the second anisotropic conductive film, the conductive particles of the second anisotropic conductive film forming conductive paths between the printed circuit board and the plurality of core substrates.

12. The semiconductor device of claim 9, wherein the first redistribution structure comprises a first metallization pattern, a first core substrate of the plurality of core substrates comprises a first under bump metallization (UBM), the first metallization pattern being electrically connected to the first UBM by a conductive path formed by the conductive particles of the first anisotropic conductive film.

13. The semiconductor device of claim 12, wherein the first metallization pattern is electrically connected to the first UBM by more than one conductive path formed by the conductive particles of the first anisotropic conductive film.

14. The semiconductor device of claim 8, further comprising:
a printed circuit board attached to the third redistribution structures of the plurality of core substrates with a first set of solder connectors, the first set of solder connectors being directly coupled to both the third redistribution structures of the plurality of core substrates and the printed circuit board.

15. A semiconductor device, comprising:
a first redistribution structure, the first redistribution structure having a first side and a second side;
a plurality of core substrates, each core substrate of the plurality of core substrates having a first side and a second side, the first side having a second redistribution structure, the second side having a third redistribution structure, the second redistribution structure of the first side of each of the plurality of core substrates attached to the first side of the first redistribution structure using a first anisotropic conductive film;
a molding layer encapsulating each core substrate of the plurality of core substrates, the molding layer physically contacting the first anisotropic conductive film and the first redistribution structure;
an integrated circuit package attached to the second side of the first redistribution structure by first conductive connectors; and
a printed circuit board attached to the third redistribution structures of the plurality of core substrates with a first set of solder connectors, the first set of solder connectors being directly coupled to both the third redistribution structures of the plurality of core substrates and the printed circuit board.

16. The semiconductor device of claim 15, further comprising:
a protective ring attached to the second side of the first redistribution structure encircling the integrated circuit package.

17. The semiconductor device of claim 15, wherein the first side of the first redistribution structure comprises a first metallization pattern, the first side of a first core substrate of the plurality of core substrates comprises a first under bump metallization (UBM), the first metallization pattern being electrically connected to the first UBM by more than one conductive path formed by conductive particles of the first anisotropic conductive film.

18. The semiconductor device of claim 15, wherein the first anisotropic conductive film comprises a dielectric material and conductive particles, the conductive particles of the first anisotropic conductive film forming conductive paths between the first side of the first redistribution structure and the first sides of the plurality of core substrates, the conductive particles of the first anisotropic conductive film comprise copper balls, aluminum balls, nickel balls, or metal-coated polymer balls.

19. The semiconductor device of claim 15, wherein the molding layer extends along sidewalls of each of the plurality of core substrates and the first anisotropic film.

20. The semiconductor device of claim 15, wherein the molding layer is free from though vias.

* * * * *